(12) United States Patent
Chen et al.

(10) Patent No.: US 11,854,854 B2
(45) Date of Patent: Dec. 26, 2023

(54) METHOD FOR CALIBRATING ALIGNMENT OF WAFER AND LITHOGRAPHY SYSTEM

(71) Applicant: Taiwan Semiconductor Manufacturing Company, Ltd., Hsinchu (TW)

(72) Inventors: Chang-Jen Chen, Hsinchu County (TW); Wen-Yun Wang, Taipei (TW); Yen-Chun Chen, Hsinchu (TW); Po-Ting Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 13 days.

(21) Appl. No.: 17/383,849

(22) Filed: Jul. 23, 2021

(65) Prior Publication Data
US 2023/0024673 A1    Jan. 26, 2023

(51) Int. Cl.
| | |
|---|---|
| *H01L 21/68* | (2006.01) |
| *H01L 23/544* | (2006.01) |
| *G01N 21/95* | (2006.01) |
| *G03F 9/00* | (2006.01) |

(52) U.S. Cl.
CPC ....... *H01L 21/681* (2013.01); *G01N 21/9501* (2013.01); *G03F 9/7023* (2013.01); *G03F 9/7046* (2013.01); *G03F 9/7049* (2013.01); *G03F 9/7088* (2013.01); *G03F 9/7092* (2013.01); *H01L 23/544* (2013.01)

(58) Field of Classification Search
CPC ..... G01N 21/9501; G03F 9/70; G03F 9/7003; G03F 9/7046; G03F 9/7049; G03F 9/7073; G03F 9/7076; G03F 9/708; G03F 9/7084; G03F 9/7088; G03F 9/7092; H01L 23/544; H01L 21/68; H01L 21/681; H01L 21/682

See application file for complete search history.

(56) References Cited

U.S. PATENT DOCUMENTS

| | | | | |
|---|---|---|---|---|
| 4,655,598 | A * | 4/1987 | Murakami | ........... G03F 9/7076 356/400 |
| 8,576,374 | B2 * | 11/2013 | Best | ................... G03F 7/70633 355/77 |
| 11,029,610 | B2 * | 6/2021 | Tinnemans | ......... G03F 7/70616 |

(Continued)

FOREIGN PATENT DOCUMENTS

| | | | | |
|---|---|---|---|---|
| CN | 107111250 | A * | 8/2017 | ............. G01B 11/24 |
| CN | 110967948 | A * | 4/2020 | ......... G03F 7/70633 |

(Continued)

OTHER PUBLICATIONS

Machine translation of CN-110967948-A. 8 pages. (Year: 2020).*

*Primary Examiner* — Gordon J Stock, Jr.
(74) *Attorney, Agent, or Firm* — McClure, Qualey & Rodack, LLP

(57) ABSTRACT

A method for calibrating the alignment of a wafer is provided. A plurality of alignment position deviation (APD) simulation results are obtained form a plurality of mark profiles. An alignment analysis is performed on a mark region of the wafer with a light beam. A measured APD of the mark region of the wafer is obtained in response to the light beam. The measured APD is compared with the APD simulation results to obtain alignment calibration data. An exposure process is performed on the wafer with a mask according to the alignment calibration data.

20 Claims, 6 Drawing Sheets

(56) References Cited

U.S. PATENT DOCUMENTS

| | | | |
|---|---|---|---|
| 2013/0141723 A1* | 6/2013 | Wei | G01B 11/272 |
| | | | 356/400 |
| 2015/0146188 A1* | 5/2015 | Lyulina | G03F 7/70633 |
| | | | 356/614 |
| 2016/0246185 A1* | 8/2016 | Ypma | G03F 7/70508 |
| 2016/0290796 A1* | 10/2016 | Levy | G03F 7/70525 |
| 2018/0231900 A1* | 8/2018 | Tinnemans | G03F 9/7088 |
| 2019/0079411 A1* | 3/2019 | Cekli | G03F 7/70258 |
| 2019/0086824 A1* | 3/2019 | Mathijssen | G03F 9/7076 |
| 2019/0235391 A1* | 8/2019 | Bijnen | G03F 7/705 |
| 2020/0319563 A1* | 10/2020 | Sciacca | G03F 9/7076 |
| 2021/0132509 A1* | 5/2021 | Huisman | G03F 7/70633 |
| 2022/0121129 A1* | 4/2022 | Lin | G03F 7/70616 |
| 2022/0252994 A1* | 8/2022 | Dai | G03F 9/7088 |
| 2023/0017491 A1* | 1/2023 | Tinnemans | G03F 7/70633 |

FOREIGN PATENT DOCUMENTS

| | | | | |
|---|---|---|---|---|
| WO | WO-2021001102 A1 * | 1/2021 | | G03F 7/70616 |
| WO | WO-2021254810 A1 * | 12/2021 | | |
| WO | WO-2021259559 A1 * | 12/2021 | | |
| WO | WO-2022156978 A1 * | 7/2022 | | |
| WO | WO-2022199958 A1 * | 9/2022 | | |
| WO | WO-2022207395 A1 * | 10/2022 | | |
| WO | WO-2023030832 A1 * | 3/2023 | | |

* cited by examiner

US 11,854,854 B2

METHOD FOR CALIBRATING ALIGNMENT OF WAFER AND LITHOGRAPHY SYSTEM

BACKGROUND

Integrated circuit (IC) fabrication involves forming layers of patterns on a wafer. Each layer of the wafer has to be perfectly aligned with the previous layer if the IC is to function properly. Various marks, such as alignment marks and overlay marks, can be used to aid in aligning these layers. In addition, the marks are also used for monitoring overlay deviation between layers. Deviation includes misalignment in the position, size, and shape between marks at successive layers. Mark misalignment may be caused by various factors such as aberration and focus position of the projection optical system when transferring patterns from a mask to a wafer. In addition, fabrication processes such as etching and chemical mechanical polishing (CMP) are likely to affect overlay mark alignment as well.

As semiconductor technology continues progressing to smaller and smaller feature sizes, alignment requirements become more and more stringent.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
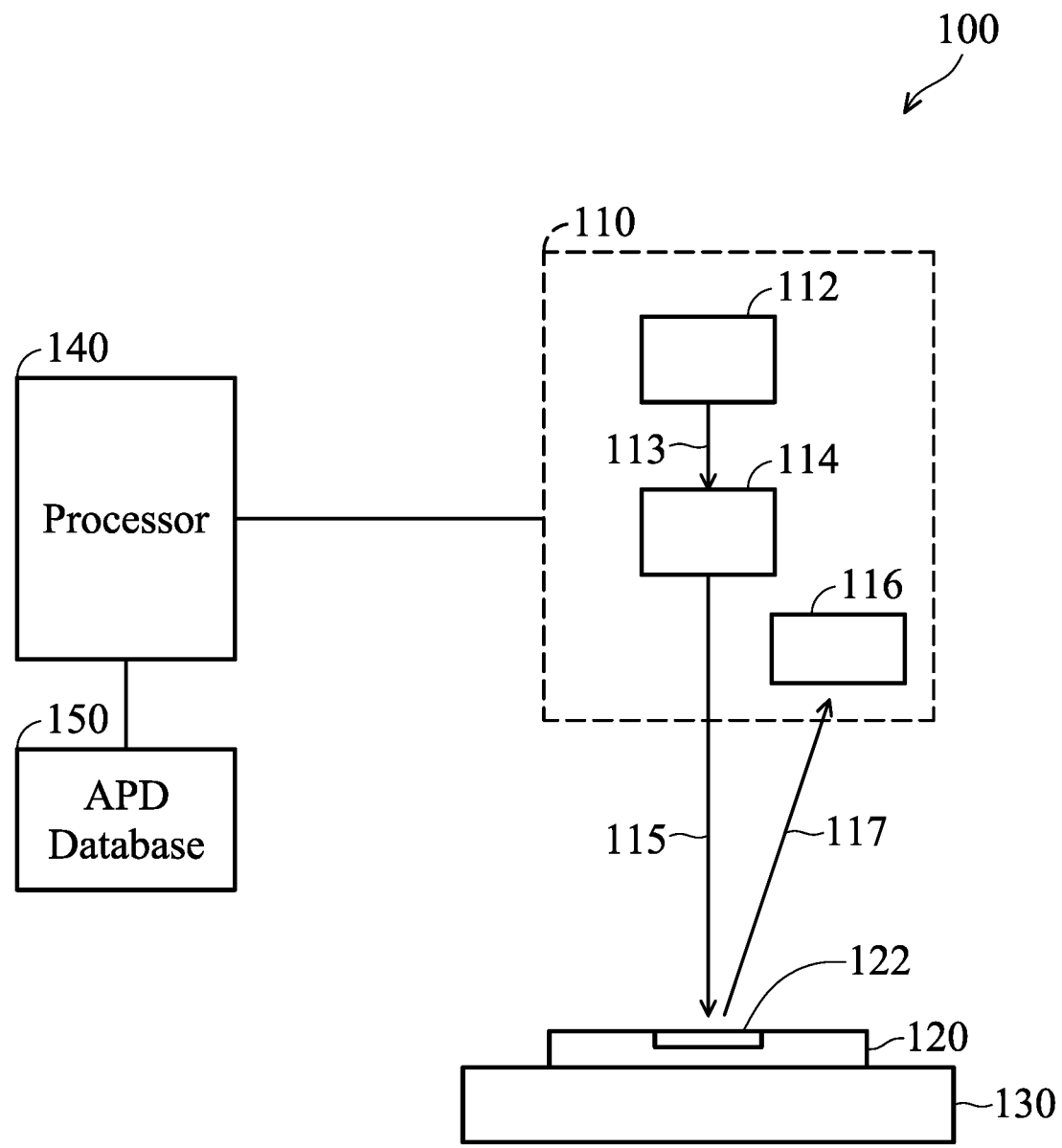
FIG. 1 shows a block diagram illustrating an alignment tool of a lithography system, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Lithographic methods are used to apply a desired pattern onto a substrate, usually onto a target portion of the substrate. Lithography is used in the manufacture of integrated circuits (ICs). During a lithographic process, a patterning device, which is alternatively referred to as a mask or a photomask, is used to generate a pattern to be formed on an individual layer of the IC. The pattern can be transferred onto a target portion on a semiconductor substrate (e.g. a wafer). Transfer of the pattern is typically by imaging onto a layer of radiation-sensitive material (resist) provided on the semiconductor substrate. A lithographic system is configured to irradiate each target portion by scanning the pattern through a radiation beam in a given direction while synchronously scanning the substrate parallel or anti parallel to the direction. In some embodiments, the lithographic system is configured to transfer the pattern from the patterning device to the semiconductor substrate by imprinting the pattern onto the semiconductor substrate.

The ICs as manufactured include a plurality of layers containing different patterns, and each layer is formed by using the lithographic system to perform an exposure process. In order to ensure proper operation of the IC that is manufactured the layers consecutively exposed need to be properly aligned to each other. Thus, the semiconductor substrates are typically provided with multiple alignment marks (also referred to as alignment targets). A position of the alignment marks is used to determine or estimate a position of a previously exposed pattern. As such, prior to the exposure of a subsequent layer, an alignment tool of the lithographic system is configured to perform an alignment analysis by measuring the position of alignment marks and determining a position of the pattern that was previously formed.

FIG. 1 shows a block diagram illustrating an alignment tool 110 of a lithography system 100, in accordance with some embodiments of the disclosure. The lithography system 100 includes the alignment tool 110 and a processor 140. The processor 140 is configured to control the alignment tool 110 to measure a semiconductor structure 120 on a stage 130. The semiconductor structure 120 includes one or more alignment mark regions (or metrology targets) 122. In some embodiments, the semiconductor structure 120 is a wafer.

The alignment tool 110 is configured to monitor the alignment marks of the alignment mark region 122. The alignment tool 110 includes a light source 112, an optical device 114 and a light detection device 116. The light source 112 is configured to provide a tunable light beam 113 to the optical device 114. The optical device 114 is configured to direct a light beam 115 to the alignment mark region 122 for alignment measurement. In such embodiments, the tunable light beam 113 is a light beam with a variable wavelength. In some embodiments, the light source 112 is configured to provide multiple tunable light beams 113 suitable for alignment measurement. In such embodiments, the tunable light beams 113 are the light beams with different wavelengths to achieve multi-wavelength alignment measurement. In some embodiments, the optical device 114 includes multiple optical components such as light polarizers, lens, mirrors, beam splitters, and/or fiber optics.

In some embodiment, the tunable light beam 113 generated by the light source 112 include visual light, infrared light, near-infrared (NIR) light, far-infrared (FIR) light, violet light, ultra-violet (UV) light or combinations thereof. In some embodiment, the light source 112 is configured to generate a red light, a green light, a NIR light and a FIR light, or a subset thereof.

In some embodiments, the light source 112 is configured to generate a red light with a wavelength of about 633 nm, a green light with a wavelength of about 532 nm, a NIR light with a wavelength of about 780 nm, a FIR light with a wavelength of about 850 nm or a subset thereof.

In some embodiments, the light source 112 is a solid state laser source, a dye laser source, or other suitable laser source with a tunable wavelength in a desired range. The light source 112 may be designed with a proper mechanism of tuning the wavelength, such as grating distributed Bragg reflector, optical cavity with a microelectromechanical system (MEMS) to tune the cavity length or other suitable mechanism. In some embodiments, the light source 112 includes a tunable dye source with a tuning range between 420 nm and about 900 nm.

The semiconductor structure 120 is positioned on the stage 130. In some embodiments, the stage 130 is moveable. The processor 140 is configured to move the stage 130 such that the light beam 115 is directed to various alignment mark regions 122 of the semiconductor structure 120. The alignment marks of the alignment mark region 122 are reflection-based or diffraction-based marks for alignment measurement. In some embodiments, the marks form a periodic pattern, such as a grating pattern. Furthermore, the alignment marks may have any suitable size, shape, and configuration, such as box-in-box, frame-in-frame, cross-in-box, box-in-bar, bar-in-bar, and diffraction gratings.

In some embodiments, the alignment mark regions 122 are configured and designed for monitoring the alignment between the semiconductor structure 120 and a mask. In some embodiments, the alignment mark regions 122 are configured and designed for monitoring the overlay errors between different pattern layers formed on and to be formed on the semiconductor structure 120.

In some embodiments, the alignment mark region 122 is positioned at the edge of the semiconductor structure 120. In some embodiments, the alignment mark region 122 is positioned in the test lines of a wafer. In some embodiments, the alignment mark region 122 is positioned in scribe-line regions between chips of the wafer. In some embodiments, the multiple alignment mark regions 122 are positioned at different locations, such as various scribe-line regions and/or cell areas.

Each alignment mark region 122 includes multiple marks stacked in the respective region. In some embodiments, the marks stacked in one region are overlay marks for monitoring the overlay error between one material layer of the semiconductor structure 120 and a patterned photoresist layer formed on the semiconductor structure 120. If the overlay error is greater than an acceptable range, then a rework process may be initiated to remove the patterned photoresist layer and form another patterned photoresist layer.

In the alignment tool 110, the light detection device 116 is configured to receive the diffracted light 117 reflected from the semiconductor structure 120. The diffracted light 117 is used to determine the alignment error. In some embodiments, the light detection device 116 is moveable, so as to receive the intended diffracted light reflected from the semiconductor structure 120.

After receiving the diffracted light 117 from the alignment mark region 122 of the semiconductor structure 120, the light detection device 116 is configured to provide information of diffracted light 117 to the processor 140. According to the information of diffracted light 117, the processor 140 is configured to obtain the alignment position deviation (APD) of the alignment marks in the alignment mark region 122.

In general, if the alignment marks are perfectly symmetric, and assuming there is no wafer deformation, the APD is zero, resulting in the best overlay. However, as a result of processing, such as etching, chemical-mechanical polishing (CMP), annealing, deposition, oxidation, etc., real alignment marks can be deformed in various ways, often resulting in asymmetries, which cannot be known beforehand.

The lithography system 100 further includes a APD database 150. In some embodiments, the APD database 150 is a storage or a memory of the lithography system 100. In some embodiments, the APD database is an external storage, and is connected to the lithography system 100 in a wired or wireless way.

The APD database 150 includes various APD simulation results. Each simulation result represents the simulated APD that is obtained by simulating a specific alignment error from the asymmetric marks of a mark profile. The asymmetric marks are caused by the process variation. The mark profiles and the related APD simulation results will be described below.

After obtaining the measured APD of the alignment mark region 122, the processor 140 is configured to compare the measured APD with the APD simulation results stored in the APD database 150, so as to obtain an estimated APD result matching the measured APD. In other words, the estimated APD result is the most similar APD simulation result of the APD simulation results, i.e., the alignment marks of the mark region 122 have a measured mark profile similar to the mark profile corresponding to the estimated APD result.

In some embodiments, the processor 140 is configured to select various candidate APD results from the APD simulation results of the APD database 150 according to the process data of the semiconductor structure 120 obtained in advance. The process data includes the parameters related to the accuracy of the aligned position determination, such as a residual overlay performance indicator (ROPI), a signal quality (SQ) or a MCC. The ROPI is the residual analysis that characterizes how well the modeled mark (or grid) fits into the measured positions of the wafer corresponding to the same process parameters. The SQ is a correlation coefficient for the fit of the signal to an expected functional form, signal strength (SS) and mark modeling parameters (translation, rotation, magnification, etc.). MCC represents the multiple correlation coefficients that indicates how well the measured signal resembles the signal expected for a perfect alignment mark. Thus, according to the measured APD of the alignment mark region 122, the processor 140 is configured to compare the measured APD with the candidate APD results, so as to obtain the estimated APD result matching the measured APD.

After obtaining the estimated APD result, the processor 140 is configured to obtain information regarding the mark profile corresponding to the estimated APD result from the APD database 150. Next, according to the information of the mark profile, the processor 140 is configured to obtain the alignment calibration data corresponding to the mark profile.

In the lithography system 100, after obtain the measured APD of the alignment mark region 122, the processor 140 is capable of searching the APD database 150 to find the possible mark profile corresponding to the estimated APD result. The alignment marks of the possible mark profile in the APD database 150 and the alignment marks of alignment mark region 122 have similar asymmetric structures. According to the possible mark profile, the processor 140 is capable of obtaining alignment calibration data for calibrating alignment in next process, such as an exposure process.

Figure 2B:
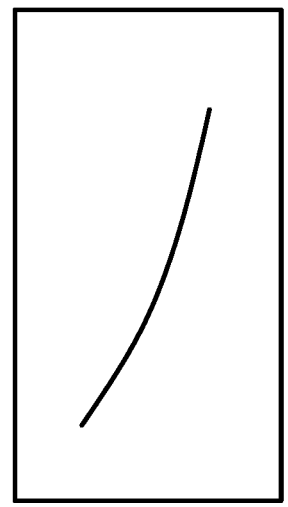
FIG. 2B shows a APD simulation result of the mark profile of FIG. 2A, in accordance with some embodiments of the disclosure.
Figure 2A:
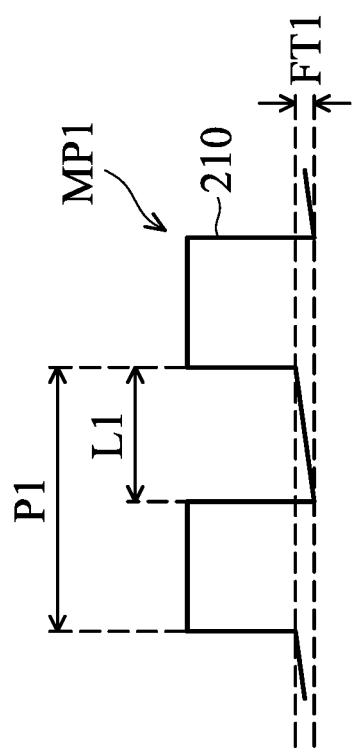
FIG. 2A shows a mark profile, in accordance with some embodiments of the disclosure.

FIG. 2A shows a mark profile MP1, in accordance with some embodiments of the disclosure. FIG. 2B shows a APD simulation result of the mark profile MP1 of FIG. 2A, in accordance with some embodiments of the disclosure. The mark profile MP1 includes periodic asymmetric marks 210. The asymmetric marks 210 are arranged according to a pitch P1 along the direction of periodicity. In the mark profile MP1, the asymmetric mark number of 2 is merely an example and is not meant to limit the current embodiments. The asymmetric marks 210 of the mark profile MN illustrate the shape of floor tilt (FT) asymmetry. In the mark profile MP1, the floor tilt of the asymmetric mark 210 is FT1 that is a difference in depth from one side of the trench to the other. For example, the right edge is lower than the left edge for the symmetric mark 210. The trench has a length L1 along the direction of periodicity. In FIG. 2B, the APD simulation result represent the simulation relationship of the ADP and a light beam with various wavelengths. When the pitch P1, the floor tilt FT1 or the length L1 changes, the APD simulation result of the mark profile MP1 will also change.

Figure 3B:
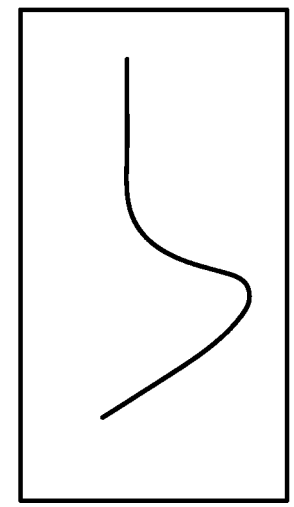
FIG. 3B shows a APD simulation result of the mark profile of FIG. 3A, in accordance with some embodiments of the disclosure.
Figure 3A:
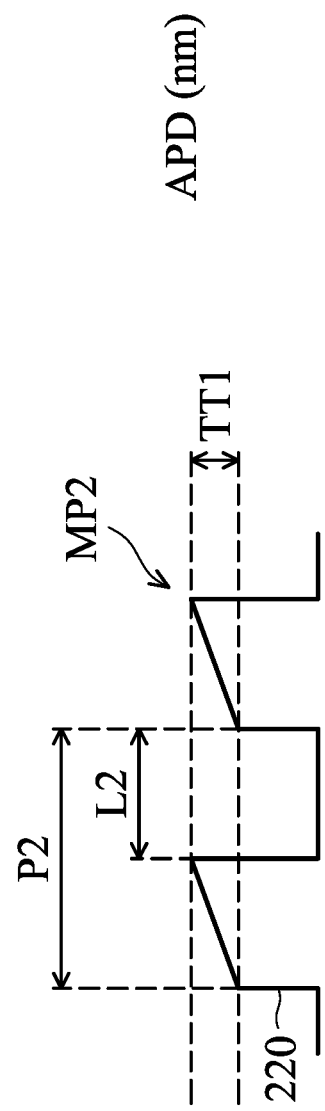
FIG. 3A shows a mark profile, in accordance with some embodiments of the disclosure.

FIG. 3A shows a mark profile MP2, in accordance with some embodiments of the disclosure. FIG. 3B shows a APD simulation result of the mark profile MP2 of FIG. 3A, in accordance with some embodiments of the disclosure. The mark profile MP2 includes periodic asymmetric marks 220. The asymmetric marks 220 are arranged according to a pitch P2 along the direction of periodicity. In the mark profile MP2, the asymmetric mark number of 2 is merely an example and is not meant to limit the current embodiments. The asymmetric marks 220 of the mark profile MP2 illustrate the shape of top tilt (TT) asymmetry. In the mark profile MP2, the top tilt of the asymmetric mark 220 is TT1 that is a difference in depth from one side of the trench to the other. For example, the left edge is lower than the right edge for the asymmetric mark 220. The trench has a length L2 along the direction of periodicity. In FIG. 3B, the APD simulation result represent the simulation relationship of the ADP and a light beam with various wavelengths. When the pitch P2, the top tilt TT1 or the length L2 changes, the APD simulation result of the mark profile MP2 will also change.

Figure 4B:
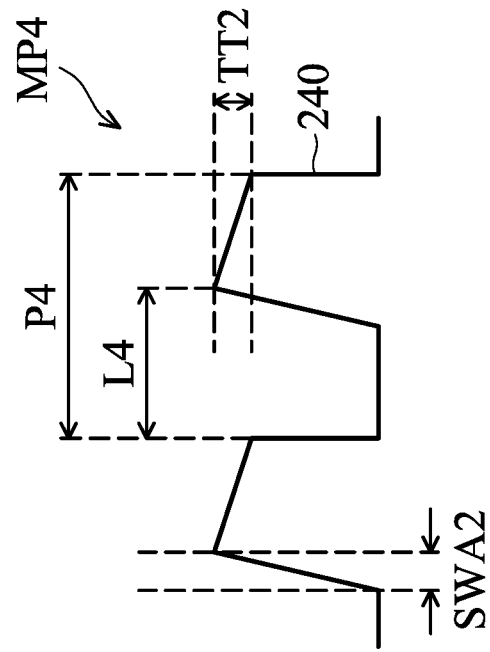
FIG. 4B shows a mark profile, in accordance with some embodiments of the disclosure.
Figure 4A:
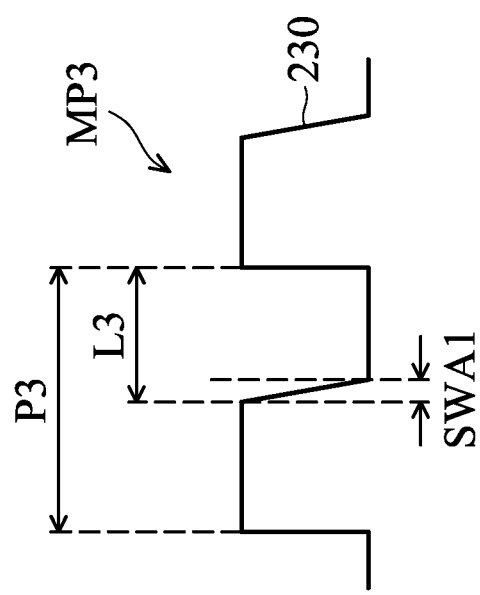
FIG. 4A shows a mark profile, in accordance with some embodiments of the disclosure.

FIG. 4A shows a mark profile MP3, in accordance with some embodiments of the disclosure. The mark profile MP3 includes periodic asymmetric marks 230. The asymmetric marks 230 are arranged according to a pitch P3 along the direction of periodicity. In the mark profile MP3, the asymmetric mark number of 2 is merely an example and is not meant to limit the current embodiments. The asymmetric marks 230 of the mark profile MP3 illustrate the shape of side wall angle (SWA) asymmetry. In the mark profile MP3, the right side wall of the asymmetric mark 230 has a slope SWA1, i.e., the right side wall and the left side wall of the asymmetric mark 230 have different slopes relative to the trenches. The trench has a length L3 along the direction of periodicity. As described above, the APD simulation result corresponding to the mark profile MP3 can be obtained. Furthermore, when the pitch P3, the slope SWAT or the length L3 changes, the APD simulation result of the mark profile MP3 will also change.

FIG. 4B shows a mark profile MP4, in accordance with some embodiments of the disclosure. The mark profile MP4 includes periodic asymmetric marks 240. The asymmetric marks 240 are arranged according to a pitch P4 along the direction of periodicity. In the mark profile MP4, the asymmetric mark number of 2 is merely an example and is not meant to limit the current embodiments. The asymmetric marks 240 of the mark profile MP4 illustrate the shape of side wall angle (SWA) asymmetry and top tilt asymmetry. In the mark profile MP4, the top tilt of the asymmetric mark 240 is TT2. Moreover, the left side wall of the symmetric mark 240 has a slope SWA2. The trench has a length L4 along the direction of periodicity. As described above, the APD simulation result corresponding to the mark profile MP4 can be obtained. Furthermore, when the pitch P4, the slope SWA2, the top tilt TT2 or the length L4 changes, the APD simulation result of the mark profile MP4 will also change.

Figure 5:
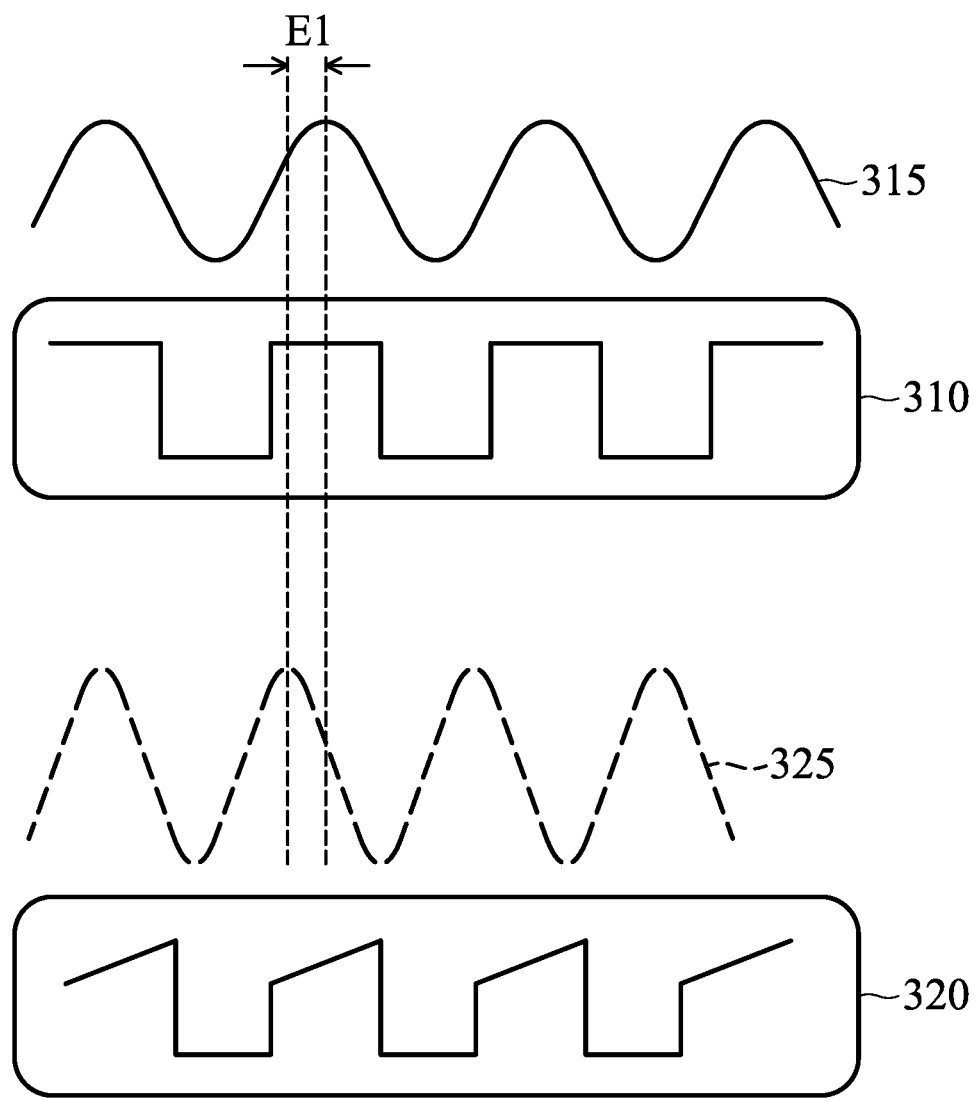
FIG. 5 shows a schematic illustrating an alignment error between perfect alignment and asymmetric alignment, in accordance with some embodiments of the disclosure.

FIG. 5 shows a schematic illustrating an alignment error E1 between perfect alignment and asymmetric alignment, in accordance with some embodiments of the disclosure. Label 310 represents the perfect alignment marks on a wafer (i.e., the semiconductor structure 120 of FIG. 1), and label 320 represent the asymmetric alignment marks on the wafer. Label 315 represents a signal from the diffracted light (e.g., the diffracted light 117 of FIG. 1) of the perfect alignment marks 310 and measured by a light sensor (i.e., the detection device 116 of FIG. 1). Moreover, Label 325 represents a signal from the diffracted light of the asymmetric alignment marks 320 and measured by the light sensor. In FIG. 5, the signals 315 and 325 have different amplitudes. For example, the amplitude of the signal 325 is greater than the amplitude of the signal 315. Furthermore, there is the alignment error E1 between the signals 315 and 325, for example, from the peak of the signal 315 to the peak of the signal 325.

Figure 6:
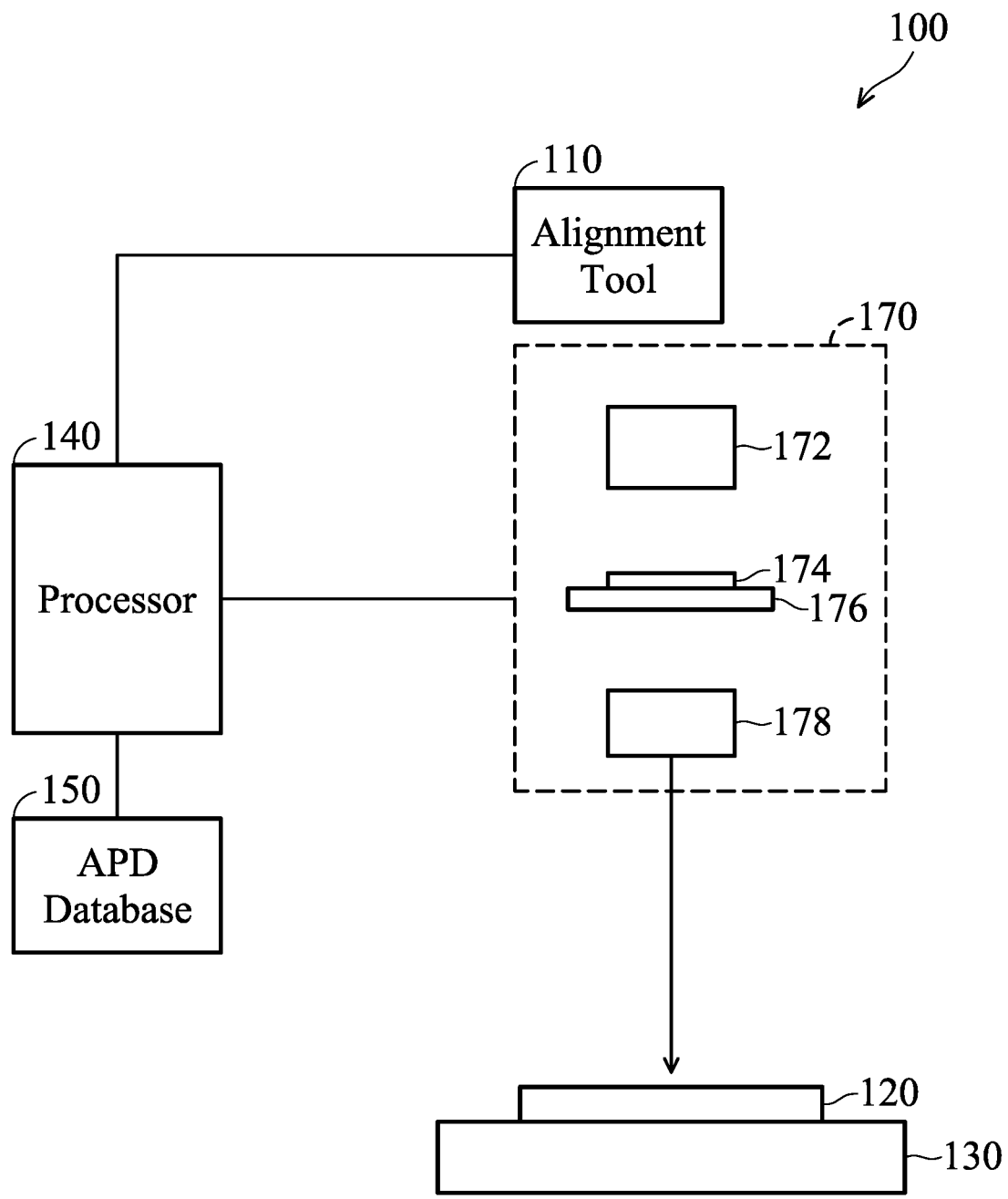
FIG. 6 shows a block diagram illustrating an exposure tool of the lithography system, in accordance with some embodiments of the disclosure.

FIG. 6 shows a block diagram illustrating an exposure tool 170 of the lithography system 100, in accordance with some embodiments of the disclosure. The exposure tool 170 is configured to perform a lithography exposure process to a resist layer coated on the semiconductor structure 120 (such as a wafer) positioned on the stage 130. When the exposed resist layer is further developed, various openings are formed in the resist layer, resulting in a resist pattern (or a patterned resist layer). The semiconductor structure 120 may be subsequently etched with the resist pattern as an etch mask, thereby forming features therein or thereon for an IC.

In FIG. 6, the exposure tool 170 includes a radiation source 172 to provide radiation energy, and an optical device 178 that modulates the radiation energy by an image of a mask 174 and directs the modulated radiation energy to the resist layer coated on the semiconductor structure 120.

The radiation source 172 may be any radiation source suitable for exposing a resist layer. In some embodiments, the radiation source 172 may include a light source selected from the group consisting of ultraviolet (UV) source, deep UV (DUV) source, extreme UV (EUV) source, and X-ray source. For example, the radiation source 172 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm). In some embodiments, the radiation source 172 is an EUV source having a wavelength of about 13.5 nm or less. In some embodiments, the radiation source 172 is an electron beam (e-beam) source for exposing a resist layer by a proper mode, such as direct writing, without using the mask 174 during the exposing processes.

The optical device 178 may be designed to have a refractive mechanism or a reflective mechanism. In the refractive mechanism, the optical device 178 includes various refractive components, such as lenses. In the reflective mechanism, the optical device 178 includes various reflective components, such as mirrors.

In some embodiments, the optical device 178 includes an illumination unit (e.g., a condenser). The illumination unit may include a single lens or a lens module having multiple lenses and/or other lens components. For example, the illumination unit may include microlens arrays, shadow masks, and/or other structures designed to aid in directing radiation energy from the radiation source 172 onto the semiconductor structure 120.

In some embodiments, the optical device 178 includes a projection unit. The projection unit may have a single lens element or a plurality of lens elements configured to provide proper illumination to the resist layer on the semiconductor structure 120. The optical device 178 may further include additional components such as an entrance pupil and an exit pupil to form an image of the mask 174 on the semiconductor structure 120.

The mask 174 is secured on the stage 176 by a clamping mechanism, such as vacuum clamping or e-chuck clamping. During the exposure process of the lithography system 100, an IC pattern defined on the mask 174 is imaged on the resist layer of the semiconductor structure 120.

In some embodiments, the mask 174 includes a transparent substrate and a patterned absorption layer. The transparent substrate may use fused silica (SiO$_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr). A light beam may be partially or completely blocked when directed on an absorption region. The absorption layer may be patterned to have one or more openings through which a light beam may travel without being absorbed by the absorption layer. The mask 174 may incorporate other resolution enhancement techniques such as phase shift mask (PSM) and/or optical proximity correction (OPC). The absorption layer may include a metal film such as chromium (Cr) for absorbing light directed thereon. The absorption layer is further patterned to have one or more openings in the metal film through which a light beam may travel without being completely absorbed. In some embodiments, the radiation source 172 is configured to generate EUV radiation, and the mask 174 is designed to have reflective mechanism. For example, the mask 174 may include a substrate coated with tens of alternating layers of silicon and molybdenum to act as a Bragg reflector that maximizes the reflection of EUV The mask 174 includes a mark region formed by a plurality of alignment marks (not shown). The alignment marks are used for aligning a wafer (e.g., the semiconductor structure 120) and a mask (e.g., the mask 174). In general, the overlay marks are used for measuring overlay deviations between two layers on a wafer (e.g., the semiconductor structure 120). The mask 174 is secured on the stage 176 which is configured to move such that the image of the mask 174 is projected onto a target area of the semiconductor structure 120. The alignment marks are transferred to the semiconductor structure 120 and eventually becomes the alignment marks in the alignment mark regions of the semiconductor structure 120 through exposing, developing, etching, deposition, and other processes. As described above, the alignment marks may be disposed in a cell region or a scribe line region of the semiconductor structure 120. The alignment marks may be reflection-based or diffraction-based, and may have any suitable size, shape, and configuration, such as box-in-box, frame-in-frame, cross-in-box, box-in-bar, bar-in-bar, and diffraction gratings.

In some embodiments, when the radiation energy from the radiation source 172 is EUV energy, the mask 174 is designed to have reflective mechanism. The mask 174 includes a substrate coated with a plurality of films to provide a reflective mechanism. For example, the mask 174 includes tens alternating layers of silicon and molybdenum deposited on a substrate to act as a Bragg reflector that maximizes the reflection of EUV light. In some embodiments, the mask 174 further includes an absorption layer, such as a tantalum boron nitride film, patterned to define a layout pattern of an integrated circuit. The mask 174 may further include a capping layer, such as ruthenium, to prevent oxidation.

The lithography system 100 may be designed differently according to different characteristics of the radiation source 172 and other factors. In some embodiments, the radiation source 172 is replaced by an electron source to provide electron beam (e-beam) for exposing the photoresist layer on the semiconductor structure 120 by a proper mode, such as direct writing. In this case, the mask 174 is eliminated during the exposing process. The IC pattern is defined in a database and is used for the direct writing during the exposing process. Additionally, the photoresist layer on the semiconductor structure 120 is replaced by a resist material sensitive to the electrons and the optical device 178 is replaced by various suitable components with a mechanism (such as electromagnetic and/or electrostatic) to control the e-beam such that the IC pattern is written on the resist layer.

In some embodiments, the processor 140 is configured to control the exposure tool 170 to expose a resist layer coated on the semiconductor structure 120. The exposed resist layer is subsequently used for etching the semiconductor structure 120, as part of a fabrication process for forming a layer on the semiconductor structure 120 with IC patterns. The fabrication process may include etching, deposition, CMP, annealing, ion implantation, oxide growth, epitaxial growth, and/or other suitable processes. This repeats, layer by layer, for forming multiple layers on the semiconductor structure 120. The multiple layers have to be aligned with each other in order for the final IC to function properly. In the fabrication process, the alignment marks are used for monitoring the asymmetric marks on the semiconductor structure 120. The monitored results are then used (e.g., by the alignment tool 110 and the processor 140) to perform a mask alignment, which is an alignment of the mask 174, for adjusting the alignment of the mask 174 and the semiconductor structure 120 in the exposure processes.

In general, overlay shift may arise from optical aberration, illumination asymmetry and variations, mask/substrate stage tilt and misalignment, and other asymmetries in a lithography system (exposure-tool-induced overlay shift). Overlay shift may also arise from distortion caused by wafer fabrication processes, such as etching, CMP, sputtering deposition, and other processes (process-induced overlay shift). It would be advantageous to know the amount of overlay shift between a layer to be formed (new layer) and the underlying layer so that the new layer can be properly compensated when it is formed.

In FIG. 6, a close estimate of the asymmetric marks is possible by comparing the existing asymmetric marks measured by the alignment tool 110 and the APD simulation results stored in the APD database 150. As described above, the alignment tool 110 is configured to perform alignment monitoring and measurement on the semiconductor structure 120. Moreover, according to the possible mark profile of the APD simulation result, the processor 140 is capable of obtaining the alignment calibration data. According to the alignment calibration data, the processor 140 is configured to perform a mask alignment of the mask 174 by moving the stage 176 or the stage 130, so as to calibrate the position of the alignment marks on the mask 174. Thus, the mask 174 is correctly transferred to the semiconductor structure 120.

Figure 7:
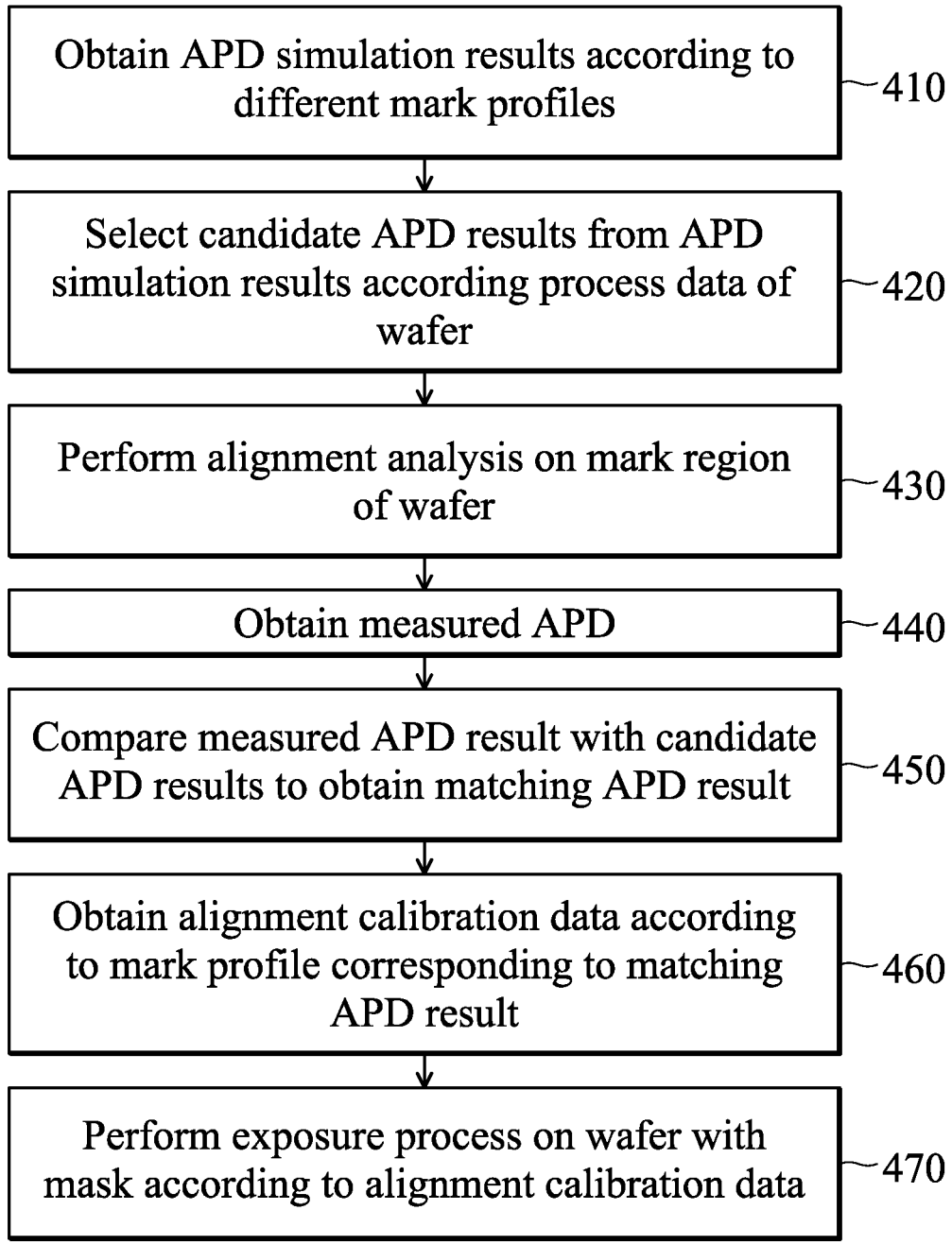
FIG. 7 shows a method for calibrating alignment of a wafer, in accordance with some embodiments of the disclosure.

FIG. 7 shows a method for calibrating the alignment of a wafer, in accordance with some embodiments of the disclosure. The method of FIG. 7 is performed by a lithography system, such as the lithography system 100 of FIG. 1 and FIG. 6.

First, in operation 410, multiple APD simulation results are obtained by a processor according to different mark profiles, and then stored in a storage (e.g., the APD database 150). Each APD simulation result is obtained from individual mark profile, and the mark profile is formed by multiple asymmetric marks. As described above, the asymmetric marks of each mark profile have the same shape of top tilt asymmetry, floor tilt asymmetry, side wall angle asymmetry or a combination thereof. In some embodiments, the processor is a processor embedded in the lithography system, such as the processor 140. In some embodiments, the processor is an external processor outside the lithography system.

In operation 420, according to the process data corresponding to the wafer, the candidate APD results is selected from the APD simulation results by the processor. As described above, the process data includes the parameters related to the accuracy of the aligned position determination, such as ROPI, SQ or MCC.

In operation 430, an alignment analysis is performed on a mark region of the wafer by an alignment tool (e.g., the alignment tool 110) of the lithographic system with a light beam (e.g., the light beam 115 of FIG. 1). In the wafer, the mark region includes periodic alignment marks. Next, according to the diffracted light (e.g., the diffracted light 117 of FIG. 1) reflected from the wafer, the measured APD of the mark region is obtained (operation 440).

In operation 450, after obtaining the measured APD, the measured APD is compared with the candidate APD results obtained in operation 720 by the processor, so as to obtain an estimated APD result. The estimated APD result is the candidate APD result matching the measured APD.

In operation 460, according to the estimated APD result, information regarding the mark profile corresponding to the estimated APD result is obtained from the APD database, and then the alignment calibration data corresponding to the mark profile is obtained by the processor.

In operation 470, an exposure process is performed on the wafer with a mask by an exposure tool of the lithography system, such as the exposure tool 170 of FIG. 6. Before performing the exposure process, a mask alignment is performed to position the mask according to the alignment calibration data. Thus, the mask is correctly transferred on the wafer. In some embodiments, the mask alignment is performed only based on the alignment calibration data without overlay measurement.

Embodiments of lithography systems and methods for calibrating alignment of a wafer are provided. The lithography system is capable of performing an inline alignment error calibration on the wafer according to various APD simulation results to obtain alignment calibration data for the exposure process. Each APD simulation result is obtained based on a mark profile, and the mark profile is formed by periodic marks that have the same asymmetric shape. After the alignment error calibration, the lithography system is capable of obtaining good positioning for an exposure process according to the alignment calibration data. In the lithography system, the APD database is used for inline alignment in-situ calibration to decrease the alignment error and further improve overlay performance.

In some embodiments, a method for calibrating alignment of a wafer is provided. A plurality of alignment position deviation (APD) simulation results are obtained form a plurality of mark profiles. An alignment analysis is performed on a mark region of the wafer with a light beam. A measured APD of the mark region of the wafer is obtained in response to the light beam. The measured APD is compared with the APD simulation results to obtain alignment calibration data. An exposure process is performed on the wafer with a mask according to the alignment calibration data.

In some embodiments, a method for calibrating alignment of a wafer is provided. An alignment analysis is performed on a mark region of the wafer to obtain a measured alignment position deviation (APD) of the mark region of the wafer. Alignment calibration data is obtained according to the measured APD and a plurality of APD simulation results. An exposure process is performed on the wafer according to the alignment calibration data. Each of the APD simulation results is obtained according to a mark profile, and the mark profile is formed by a plurality of periodic marks.

In some embodiments, a lithography system is provided. The lithography system includes an alignment tool, a processor and an exposure tool. The alignment tool is configured to perform an alignment analysis on a mark region of a wafer with a light beam and obtain the APD of the mark region of the wafer in response to the light beam. The processor is configured to obtain a plurality of APD simulation results according to a plurality of mark profiles, and compare the measured APD with the APD simulation results to obtain alignment calibration data. The exposure tool is configured to perform an exposure process on the wafer with a mask according to the alignment calibration data.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for calibrating alignment of a wafer, comprising:
    obtaining a plurality of alignment position deviation (APD) simulation results from a database according to a plurality of mark profiles;
    performing an alignment analysis on a mark region of the wafer with a light beam;
    obtaining a measured APD of the mark region of the wafer in response to the light beam;
    comparing the measured APD with the APD simulation results to obtain alignment calibration data; and
    performing an exposure process on the wafer with a mask according to the alignment calibration data,
    wherein the alignment calibration data corresponds to an estimated APD result of the APD simulation results that has alignment error of the mark profile of the estimated APD result, and wherein the mark profile of the estimated APD result corresponds to a measured mark profile of a plurality of alignment marks of the mark region of the wafer, and
    wherein the alignment error is obtained between a first peak of a diffracted light of a perfect mark profile and a second peak of a diffracted light of the mark profile of the estimated APD result.

2. The method as claimed in claim 1, wherein each of the mark profiles is obtained from a plurality of periodic marks with the same asymmetric shape.

3. The method as claimed in claim 1, further comprising:
    selecting a plurality of candidate APD results from the APD simulation results according to process data of the wafer.

4. The method as claimed in claim 3, wherein comparing the measured APD with the APD simulation results to obtain the alignment calibration data further comprises:
    comparing the measured APD with the candidate APD results to obtain the estimated APD result that is the candidate APD result matching the measured APD; and
    obtaining the alignment calibration data according to the mark profile corresponding to the estimated APD result.

5. The method as claimed in claim 1, wherein performing the alignment analysis on the mark region of the wafer with the light beam further comprises:
    directing the light beam with a variable wavelength to the mark region of the wafer, wherein the mark region comprises the alignment marks.

6. The method as claimed in claim 1, wherein obtaining the measured APD of the mark region of the wafer in response to the light beam further comprises:
    measuring a diffracted light of the alignment marks from the mark region in response to the light beam; and
    obtaining the measured APD according to the diffracted light of the alignment marks.

7. The method as claimed in claim 1, wherein performing the exposure process on the wafer with the mask according to the alignment calibration data further comprises:
    performing a mask alignment on the mask according to the alignment calibration data; and
    performing the exposure process on the wafer with the mask after the mask alignment is performed.

8. A method for calibrating alignment of a wafer, comprising:
    performing an alignment analysis on a mark region of the wafer to obtain a measured alignment position deviation (APD) of the mark region of the wafer;
    obtaining alignment calibration data according to the measured APD and a plurality of APD simulation results; and
    performing an exposure process on the wafer according to the alignment calibration data,
    wherein each of the APD simulation results is obtained from a database and corresponds to a mark profile, and the mark profile is formed by a plurality of periodic marks with the same asymmetric shape,
    wherein the alignment calibration data corresponds to an estimated APD result of the APD simulation results that has alignment error of the mark profile of the estimated APD result, and wherein the mark profile of the estimated APD result corresponds to a measured mark profile of a plurality of alignment marks of the mark region of the wafer, and
    wherein the alignment error is obtained between a first peak of a diffracted light of a perfect mark profile and a second peak of a diffracted light of the mark profile of the estimated APD result.

9. The method as claimed in claim 8, wherein obtaining the alignment calibration data according to the measured APD and the APD simulation results further comprises:
    selecting a plurality of candidate APD results from the APD simulation results according to process data of the wafer.

10. The method as claimed in claim 9, wherein obtaining the alignment calibration data according to the measured APD and the APD simulation results further comprises:
    comparing the measured APD with the candidate APD results to obtain the estimated APD result that is the candidate APD result matching the measured APD; and
    obtaining the alignment calibration data according to the mark profile corresponding to the estimated APD result.

11. The method as claimed in claim 8, wherein performing the alignment analysis on the mark region of the wafer to obtain the measured APD of the mark region of the wafer further comprises:
    directing a light beam with a variable wavelength to the mark region of the wafer, wherein the mark region comprises the alignment marks.

12. The method as claimed in claim 11, wherein performing the alignment analysis on the mark region of the wafer to obtain the measured APD of the mark region of the wafer further comprises:
    measuring a diffracted light of the alignment marks from the mark region in response to the light beam; and
    obtaining the measured APD according to the diffracted light of the alignment marks.

13. The method as claimed in claim 8, wherein performing the exposure process on the wafer according to the alignment calibration data further comprises:
    performing a mask alignment on a mask according to the alignment calibration data; and performing the exposure process on the wafer with the mask after the mask alignment is performed.

14. A lithography system, comprising:
- an alignment tool configured to perform an alignment analysis on a mark region of a wafer with a light beam and obtain a measured alignment position deviation (APD) of the mark region of the wafer in response to the light beam;
- a processor configured to obtain a plurality of APD simulation results according to a plurality of mark profiles, and compare the measured APD with the APD simulation results to obtain alignment calibration data; and
- an exposure tool configured to perform an exposure process on the wafer with a mask according to the alignment calibration data, wherein the alignment calibration data corresponds to the APD simulation result that has alignment error of the mark profile corresponding to a measured mark profile of a plurality of alignment marks of the mark region of the wafer, and
- wherein the alignment error of the mark profile is obtained between a first peak of a diffracted light of a perfect mark profile and a second peak of a diffracted light of the mark profile.

15. The lithography system as claimed in claim 14, wherein each of the mark profiles is obtained from a plurality of periodic marks with the same asymmetric shape.

16. The lithography system as claimed in claim 14, wherein the processor is further configured to select a plurality of candidate APD results from the APD simulation results according to process data of the wafer.

17. The lithography system as claimed in claim 16, wherein the processor is configured to compare the measured APD with the candidate APD results to obtain an estimated APD result that is the candidate APD result matching the measured APD, and the alignment calibration data is obtained from the mark profile corresponding to the estimated APD result.

18. The lithography system as claimed in claim 14, wherein the alignment tool comprises:
- a light source configured to direct the light beam with a variable wavelength to the mark region of the wafer, wherein the mark region comprises a plurality of alignment marks.

19. The lithography system as claimed in claim 14, wherein the alignment tool further comprises:
- a light sensor detection device configured to measure a diffracted light of the alignment marks from the mark region in response to the light beam, and obtain the measured APD according to the diffracted light.

20. The lithography system as claimed in claim 14, wherein the exposure tool is configured to perform a mask alignment on the mask according to the alignment calibration data, and to perform the exposure process on the wafer with the mask after the mask alignment is performed.

* * * * *